(12) United States Patent
Hsieh et al.

(10) Patent No.: US 7,440,071 B2
(45) Date of Patent: Oct. 21, 2008

(54) DISPLAY DEVICE AND METHOD FOR FABRICATING DISPLAY DEVICE

(75) Inventors: Cheng-Hsi Hsieh, Kaohshiung (TW); Shie-Chang Jeng, Ligang Township, Pingtung County (TW); Hsing-Lung Wang, Pingjhen (TW); Chi-Chang Liao, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 343 days.

(21) Appl. No.: 11/454,736

(22) Filed: Jun. 16, 2006

(65) Prior Publication Data

US 2007/0153172 A1 Jul. 5, 2007

(30) Foreign Application Priority Data

Dec. 29, 2005 (TW) .............................. 94147156 A

(51) Int. Cl.
*G02F 1/1339* (2006.01)

(52) U.S. Cl. ..................... 349/156; 349/155; 349/114

(58) Field of Classification Search ......... 349/155–156, 349/114
See application file for complete search history.

(56) References Cited

U.S. PATENT DOCUMENTS

| 7,286,198 | B2 * | 10/2007 | Wang et al. ............... 349/114 |
| 2002/0196387 | A1 | 12/2002 | Kimura ..................... 349/61 |
| 2003/0218595 | A1 | 11/2003 | Eldon et al. ............... 345/107 |

FOREIGN PATENT DOCUMENTS

CN        1648735        8/2005

* cited by examiner

*Primary Examiner*—David C. Nelms
*Assistant Examiner*—Phu Vu
(74) *Attorney, Agent, or Firm*—J.C. Patents

(57) ABSTRACT

A display device is provided, which includes a first structural substrate with multiple pixel regions. At least one of the pixel regions has an emissive region and a reflective region. A wall structure is located on the first structural substrate, and surrounds a periphery of the emissive region and the reflective region for separating the emissive region and the reflective region. An emissive structure is disposed in the emissive region of the first structural substrate. A reflective displaying structure is disposed in the reflective region of the first structural substrate. In addition, a second structural substrate covers the wall structure.

29 Claims, 8 Drawing Sheets

DISPLAY DEVICE AND METHOD FOR FABRICATING DISPLAY DEVICE

CROSS-REFERENCE TO RELATED APPLICATION

This application claims the priority benefit of Taiwan application serial no. 94147156, filed on Dec. 29, 2005. All disclosure of the Taiwan application is incorporated herein by reference.

BACKGROUND OF THE INVENTION

1. Field of Invention

The present invention relates to a display technique, and more particularly to a structure with a semi-emissive and semi-reflective display and a method for fabricating the same.

2. Description of Related Art

As for the content of information, besides texts and voices, images are also important for enriching the content of information. With the progress of science and technology, nowadays images containing text can be displayed by displays. Specially, the digital display consisting of multiple pixel units has gradually become the mainstream among displays. The flat panel display can be divided into various types according to display mode, wherein the pixels of some displays can emit light by themselves, for example, displays fabricated with organic light-emitting diodes (OLEDs); and the pixels of some displays require an external light source, for example, liquid crystal displays (LCDs). Furthermore, the external light source of an LCD can be provided by a backlight module or an ambient light.

Some displays, especially those equipped for small-sized portable electric devices, are often moved in indoor and outdoor environments of different luminance, resulting in poor display quality. To solve this problem, for example, the pixels of the conventional LCD are designed to have a reflective region and a transmissive region, wherein the reflective region takes the incident ambient light as the light source for displaying; and the transmissive region uses a backlight module as the light source for displaying.

As described in U.S. Publication No. US2002/0196387, the design is to dispose the reflective region and the emissive region as a multilayer stack structure. In this conventional stack structure, individual elements of the reflective region and the emissive region will interfere with each other in operation due to the stack structure of the elements; and the manufacturing process of the individual elements will interfere with each other and become complex accordingly. For example, due to the different heat resistances of the elements, the existed low-temperature elements may be damaged during the subsequent high-temperature process. Such problems still need to be resolved.

Therefore, the manufacturers in this field are still seeking a design that not only achieves good displaying quality but also reduces manufacturing costs. A single-layer structure is provided by the present invention, wherein the reflective region and the emissive region are designed to be disposed on the left and right. The details will be described below.

SUMMARY OF THE INVENTION

One of the objects of the present invention is to provide a display device. One pixel unit is divided into an emissive region and a reflective region by a wall structure so as to simplify the pixel structure. Due to the existence of the wall structure, the emissive region and the reflective region will not interfere with each other, thus improving display quality.

One of the objects of the present invention is to provide a method for fabricating the display device. One pixel unit is divided into an emissive region and a reflective region by a wall structure manufactured by way of stamping, so as to simplify the manufacturing flow and to reduce manufacturing costs.

A display device is provided by the present invention, which includes a first structural substrate with multiple pixel regions, and at least one of these pixel regions has an emissive region and a reflective region. A wall structure is located on the first structural substrate, and surrounds a periphery of the emissive region and the reflective region for separating the emissive region and the reflective region. An emissive displaying structure is disposed in the emissive region of the first structural substrate. A reflective displaying structure is disposed in the reflective region of the first structural substrate. Furthermore, a second structural substrate covers the wall structure.

According to a preferred embodiment of the present invention, in the above display device, the reflective displaying structure includes a structure that can be used for reflective displaying, such as, a liquid crystal displaying (LCD) structure, an electrophoresis displaying structure, or an electrowetting displaying structure, etc.

According to a preferred embodiment of the present invention, in the above display device, the emissive displaying structure includes an organic light-emitting diode structural layer.

According to a preferred embodiment of the present invention, in the above display device, the emissive displaying structure substantially emits lights from the first structural substrate towards the direction of the second structural substrate.

According to a preferred embodiment of the present invention, in the above display device, the reflective displaying structure includes a reflective electrode layer located on the first structural substrate to reflect an incident ambient light.

According to a preferred embodiment of the present invention, the above display device further includes an anti-reflective structural layer on the second structural substrate, corresponding to the emissive region, so as to prevent the emissive region from reflecting an incident ambient light.

According to a preferred embodiment of the present invention, the above display device includes a packing layer located within a space surrounded by the first structural substrate, the emissive displaying structure, and the wall structure.

According to a preferred embodiment of the present invention, in the above display device, the reflective displaying structure includes a reflective electrode layer located on the second structural substrate to reflect an incident ambient light.

A method for fabricating the display device is provided by the present invention, which includes: providing a first structural substrate with multiple pixel regions, wherein at least one of these pixel regions has an emissive region and a reflective region; forming a wall structure on the first structural substrate, wherein the wall structure surrounds a periphery of the emissive region and the reflective region for separating the emissive region and the reflective region; forming an emissive displaying structure in the emissive region of the first structural substrate; forming a reflective displaying structure in the reflective region of the first structural substrate; and providing a second structural substrate, which covers the wall structure.

According to a preferred embodiment of the present invention, in the above method for fabricating the display device, the step of forming the wall structure on the first substrate is carried out through a stamping process.

According to a preferred embodiment of the present invention, in the above method for fabricating the display device, the two steps of forming the emissive displaying structure and forming the reflective displaying structure are carried out separately or mixed together.

According to a preferred embodiment of the present invention, in the above method for fabricating the display device, the formed emissive displaying structure substantially emits lights from the first structural substrate towards the direction of the second structural substrate.

According to a preferred embodiment of the present invention, in the above method for fabricating the display device, the step of forming the reflective displaying structure includes forming a reflective electrode layer on the first structural substrate to reflect an incident ambient light.

According to a preferred embodiment of the present invention, in the above method for fabricating the display device, the emissive region of the second structural substrate includes an anti-reflective structural layer to prevent the emissive region from reflecting an incident ambient light.

According to a preferred embodiment of the present invention, in the above method for fabricating the display device, the formed emissive displaying structure substantially emits lights from the second structural substrate towards the direction of the first structural substrate.

According to a preferred embodiment of the present invention, in the above method for fabricating the display device, the provided first structural substrate includes an anti-reflective structural layer in the emissive region to prevent the emissive region from emitting a reflected light.

According to a preferred embodiment of the present invention, in the above method for fabricating the display device, the step of forming an emissive displaying structure includes forming a packing layer on the emissive displaying structure, wherein the height of the packing layer is equal to that of the wall structure.

According to a preferred embodiment of the present invention, in the above method for fabricating the display device, the step of forming a reflective displaying structure includes forming a reflective electrode layer on the second structural substrate in advance, to reflect an incident ambient light.

The pixel structure of the present invention is simplified through being divided into an emissive region and a reflective region by the wall structure formed by way of stamping, thus facilitating the manufacturing process and reducing manufacturing costs. Due to the existence of the wall structure, the emissive region and the reflective region will not interfere with each other, thus enhancing display quality.

In order to make aforementioned and other objects, features, and advantages of the present invention more comprehensible, preferred embodiments accompanied with appended drawings are described in detail below.

DESCRIPTION OF EMBODIMENTS

Based on the development of the light-emitting diode technique, e.g., the organic light-emitting diode (OLED), or the polymer light-emitting diode (PLED) has appeared. And then, a structure with a semi-emissive and semi-reflective display and a method for fabricating the same are provided by the present invention. It will be illustrated through the following embodiments, and the present invention is not limited to the recited embodiments.

Figure 1:
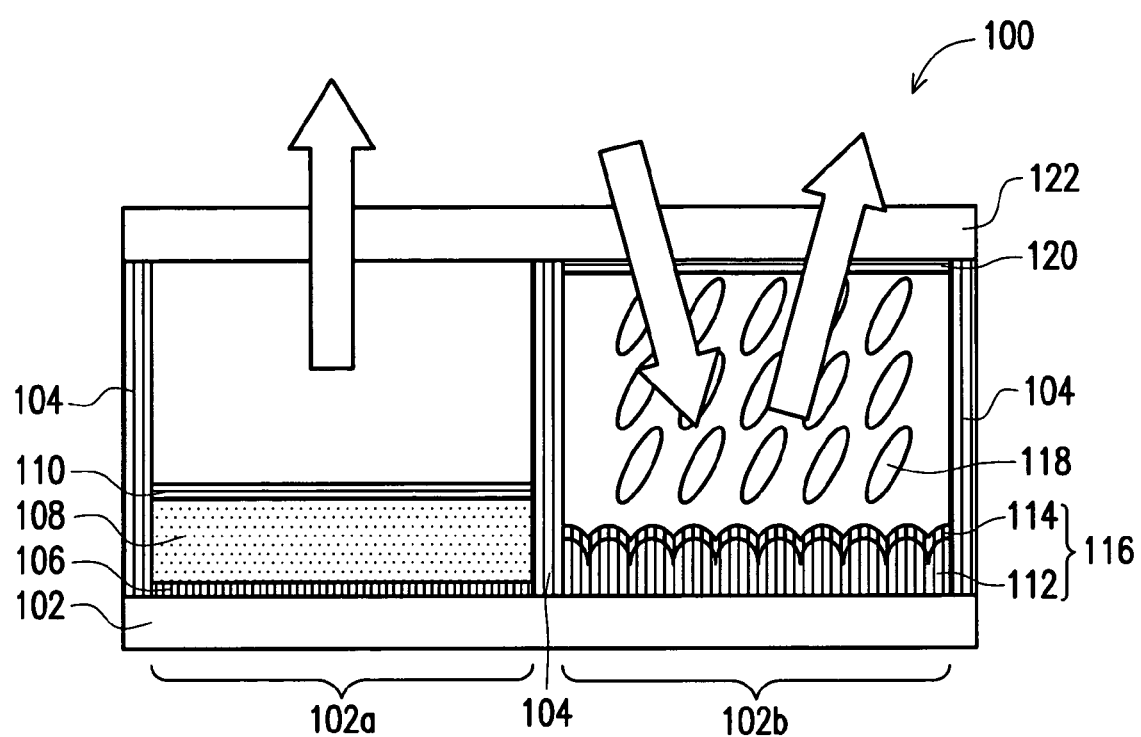
FIG. 1 depicts a schematic cross-sectional view of an emissive and reflective display structure according to one embodiment of the present invention.

FIG. 1 depicts a schematic cross-sectional view of an emissive and reflective display structure according to one embodiment of the present invention. Herein, the characteristics of the structure are described first, and the manufacturing flow chart will be described later. Referring to FIG. 1, the structure 100 with an emissive and reflective display is, e.g., a two-element structure including an OLED and a reflective LCD. The display structure 100 includes a first structural substrate 102 with multiple pixel regions. At least one or all of the pixel regions have an emissive region 102a and a reflective region 102b. Only one pixel structure is described in FIG. 1. The first structural substrate 102 is, for example, a lower substrate, wherein the lower substrate is provided with the required structures, such as a driving circuit structure, an alignment film corresponding to the liquid crystal, and other functional layers, etc. Those of ordinary skill in the art will understand the details of such structures required according to the actual design, which will not be described in detail any more herein.

Moreover, a wall structure 104 is located on the first structural substrate 102 and surrounds a periphery of the emissive region 102a and the reflective region 102b. Meanwhile, the wall structure 104 separates the emissive region 102a and the reflective region 102b to form two separated spaces, which can be used to accommodate an emissive displaying structure and a reflective displaying structure respectively. The emissive displaying structure is, for example, an OLED or a polymer light-emitting diode (PLED). The emissive displaying structure includes a lower electrode layer 106, a light-emitting active layer 108, and an upper electrode layer 110, wherein the light-emitting active layer 108 is sandwiched between the lower electrode layer 106 and the upper electrode layer 110. The current or voltage is applied to the light-emitting active layer 106 for emitting light.

In addition, the embodiment of the reflective displaying structure in FIG. 1 takes an LCD structure as an example. As for the LCD structure, only some main relevant structures are depicted herein, and other relevant structures, such as the driving circuit and the functional layer, can also be fabricated on the first structural substrate 102. Before the liquid crystal is injected, a lower electrode structural layer 116 is disposed on the first structural substrate 102. This lower electrode structural layer 116 can reflect the incident ambient light, that is, the reflective LCD structure takes the ambient light as a light source. In order to obtain a uniform reflection effect, the lower electrode structural layer 116 includes a roughened-surface structural layer 112 and a reflective electrode layer 114 on the roughened-surface structural layer 112. The surface of the roughened-surface structural layer 112 is roughened, such that the incident light can be uniformly scattered towards other directions. The surface of the reflective electrode layer 114 is conformal to that of the roughened-surface structural layer 112, being a roughened-surface structure. The reflective electrode layer 114, made of metal materials, can be used to reflect the incident light, besides being used as an electrode layer for driving the liquid crystal.

Then, a liquid crystal layer 118 is injected into an accommodation space surrounded by the wall structure 104 and the corresponding reflective region 102b through the ink jet printing and the like. In addition, a second structural substrate 122 covers the wall structure 104 for sealing the emissive region 102a and the reflective region 102b. Just like the first structural substrate 102, the second structural substrate 122 also has the element structures required by the actual design, including an upper electrode layer 120. This upper electrode layer 120 and the reflective electrode layer 114 are used for controlling the orientation of liquid crystal molecules of the liquid crystal layer 118, thus controlling the luminance of the reflected light. These liquid crystal displaying mechanisms are known to those of ordinary skill in the art, and will not be described in detail any more. Furthermore, the second structural substrate 122 corresponding to the reflective region 102b can also include, for example, a color filter layer and a polarizer (not shown in FIG. 1).

In the LCD structure of the reflective region 102b, the ambient light is used as a display light source; the OLED structure of the emissive region 102a can emit lights itself. Thus, since the reflective region 102b uses the ambient light as a displaying light source, when the display is in an ambience with strong light, the display contrast of the image can be maintained, such that the displaying quality can be enhanced. In contrast, when the display is in an ambience with weak light, since the light source for the reflective region 102b is weakened, the OLED structure of the emissive region 102a herein can be used to provide the required display contrast, such that a good display quality can still be achieved in this corresponding ambience.

Moreover, the above LCD structure is not the only choice for the reflective region 102b, and other structure designs also can be used, for example, the electrophoresis displaying structure or the electro-wetting displaying structure.

Figure 5A:
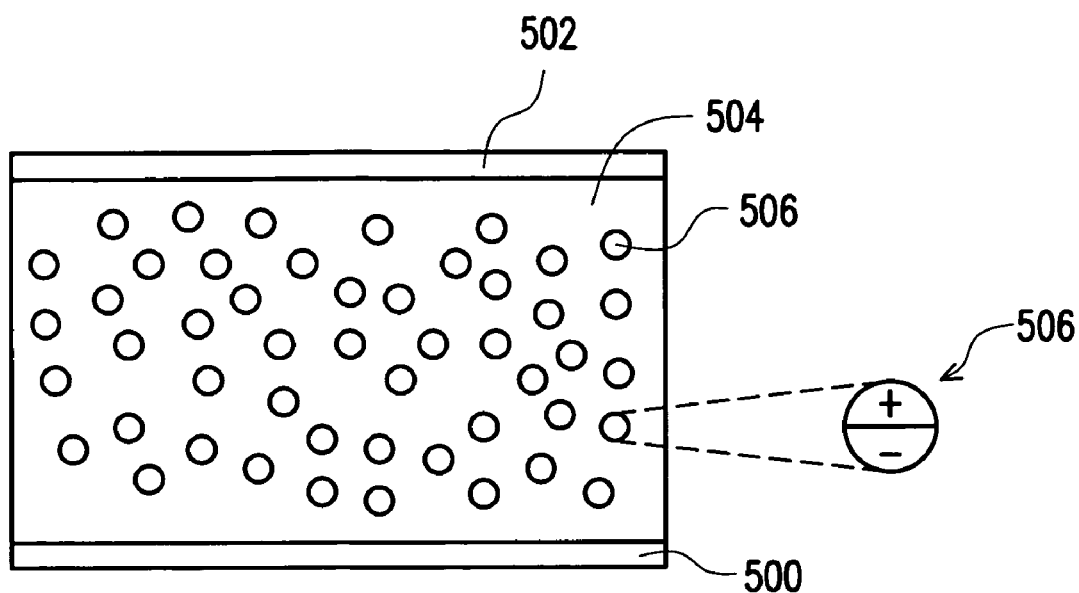
FIG. 5A-5B depict the mechanism of the electrophoresis displaying structure.
Figure 5B:
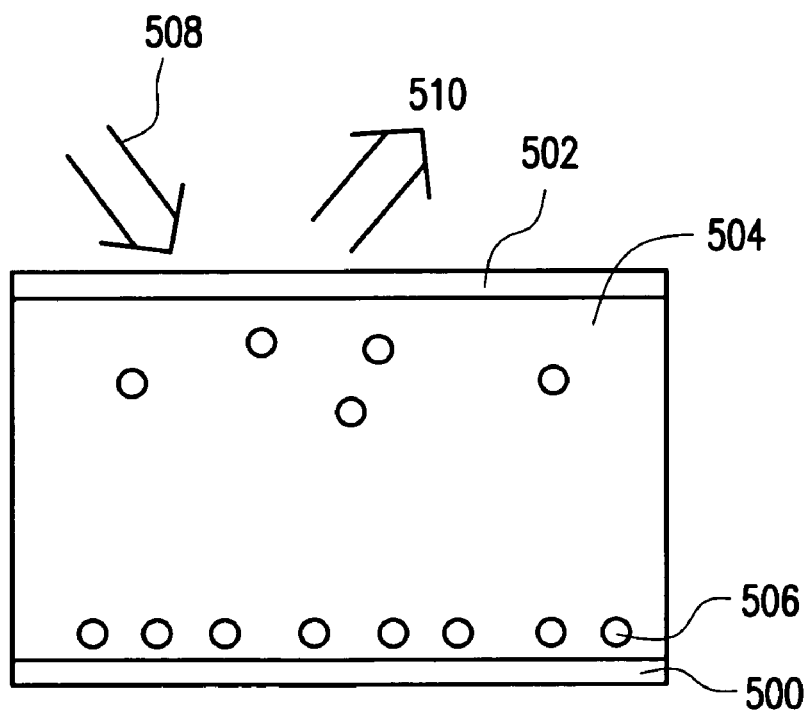
Figure 6A:
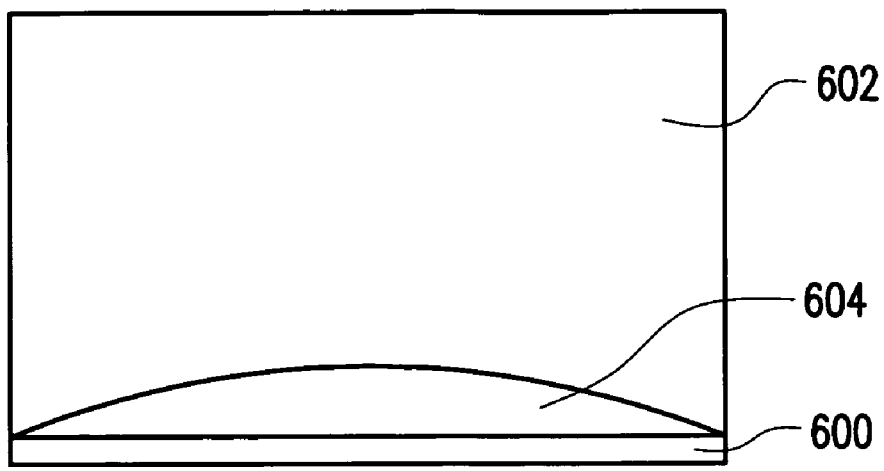
FIG. 6A-6B depict the mechanism of the electro-wetting displaying structure.
Figure 6B:
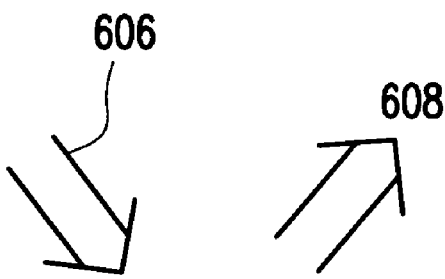
Figure 6B:
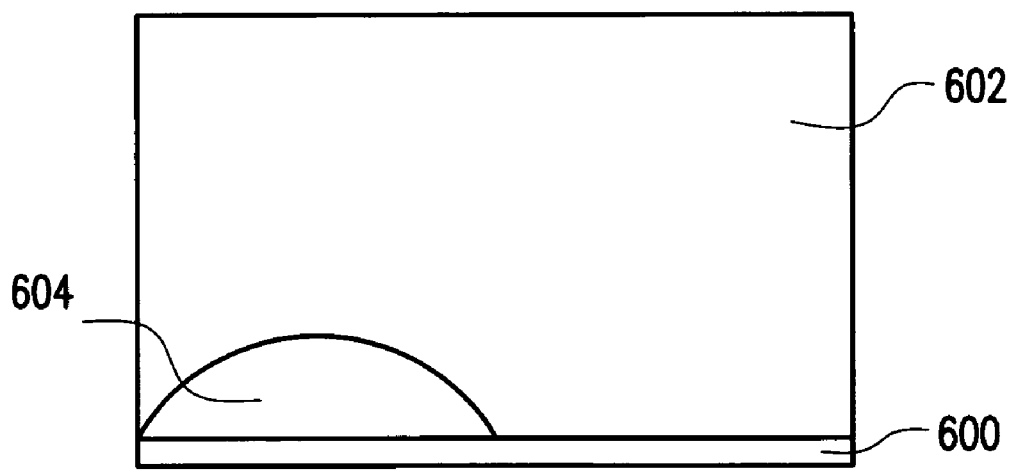

FIGS. 5A-5B depict the mechanism of the electrophoresis displaying structure. FIGS. 6A-6B depict the mechanism of the electro-wetting displaying structure. First, referring to FIG. 5A, the electrically neutral particles 506 are distributed within a space 504 between the two electrodes 500, 502. However, the particles 506 have the electric dipole characteristic, that is, the positive and negative charges on the particle 506 are, distributed at the two ends of the particle 506 and the net charge of the particle 506 is zero. In addition, the particles 506 have predetermined colors. In FIG. 5B, when a voltage is applied to the electrode 500 (the electrode 502 is grounded), a part of the particles 506 will be attracted to the electrode 500, wherein the applied voltage is association with the quantity of the attracted particles 506 to some extent. When the incident white light 508 is reflected via the electrode 500, a gray level of the color is produced according to the quantity of the atteacted colored particles 506, so as to display the required color luminance for the pixel.

As for the mechanism of the electro-wetting displaying structure, first referring to FIG. 6A, wherein an accommodation space is filled with a fluid layer, e.g., a water layer 602, and an oil drop layer 604 is disposed on the bottom reflective electrode layer 600. The oil drop layer 604 has a predetermined color, e.g., black, and the reflective electrode layer 600 is, e.g., white. When no voltage is applied to the reflective electrode layer 600, the oil drop layer 604 covers the reflective electrode layer 600, and a black color appears. In FIG. 6B, when a voltage is applied to the reflective electrode layer 600, the coherent effect of the oil drop layer 604 will be enhanced, wherein the surface strength of the coherent effect has a functional relation with the applied voltage. Therefore, the area of the reflective electrode layer 600 covered by the oil drop layer 604 can be controlled by applying a voltage to the reflective electrode layer 600, such that the gray level of a required color can be produced.

The above electrophoresis displaying structure or electro-wetting displaying structure can be used to replace the general LCD structure. The required driving circuit and the element structures can be varied according to the actual design.

Figure 2A:
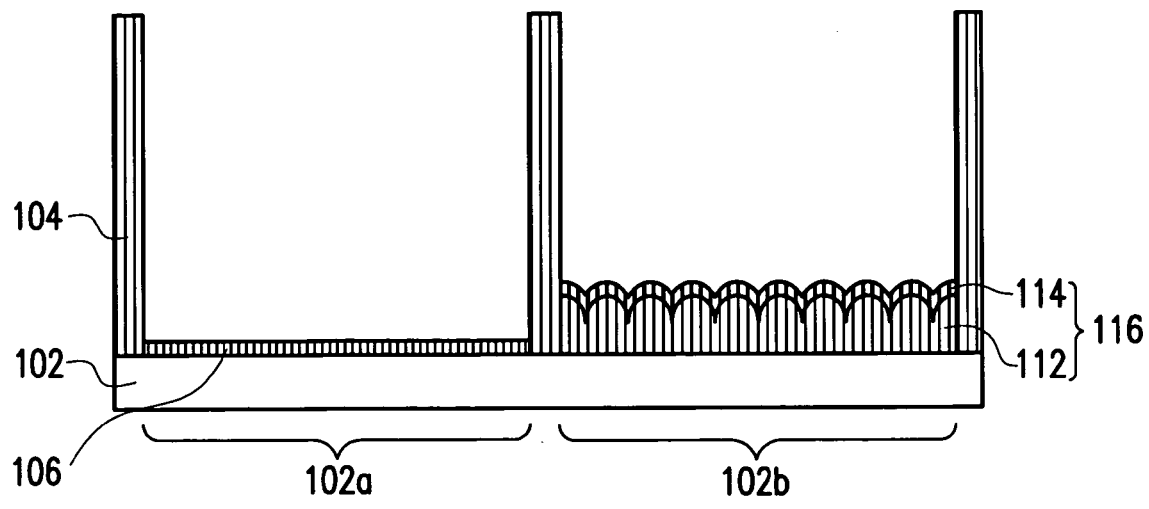
FIG. 2A-2D depict a flow chart for fabricating a display device according to one embodiment of the present invention.

One embodiment of the fabricating method is illustrated as for the structure in FIG. 1. FIGS. 2A-2D depict a flow chart for fabricating the display device according to one embodiment of the present invention. In FIG. 2A, the first structural substrate 102 is provided as a base for the subsequent structures. Some structural layers can be formed on the first structural substrate 102 in advance.

Then, a wall structure 104 is formed on the first structural substrate 102, and surrounds a periphery of the emissive region 102a and the reflective region 102b. The wall structure 104 is, for example, formed through e.g., stamping. The subsequent process, from a wide perspective, includes forming an emissive displaying structure in the emissive region 102a of the first structural substrate 102. A reflective displaying structure is formed in the reflective region 102b of the first structural substrate 102. The wall structure 104 is covered by a second structural substrate 122. The process will be described below in details.

Continuously referring to FIG. 2A, a roughened-surface structural layer 112 is formed in the reflective region 102b of the first structural substrate 102 through stamping, and a surface-roughening process is carried out to the surface of the roughened-surface structural layer 112. Additionally, an alignment film (not shown) can be firstly formed on the first structural substrate 102. Then, a lower electrode layer 106 is formed in the emissive region 102a, and a reflective electrode layer 114 is formed in the reflective region 102b. Preferably, the lower electrode layer 106 and the reflective electrode layer 114 can be formed simultaneously with the same material. All of the above element structures can be achieved by way of stamping. Furthermore, the wall structure 104 also can be formed after the above element structures have been formed. In other words, the sequence of the formation can be varied according to the actual fabrication.

Figure 2B:
Figure 2B:
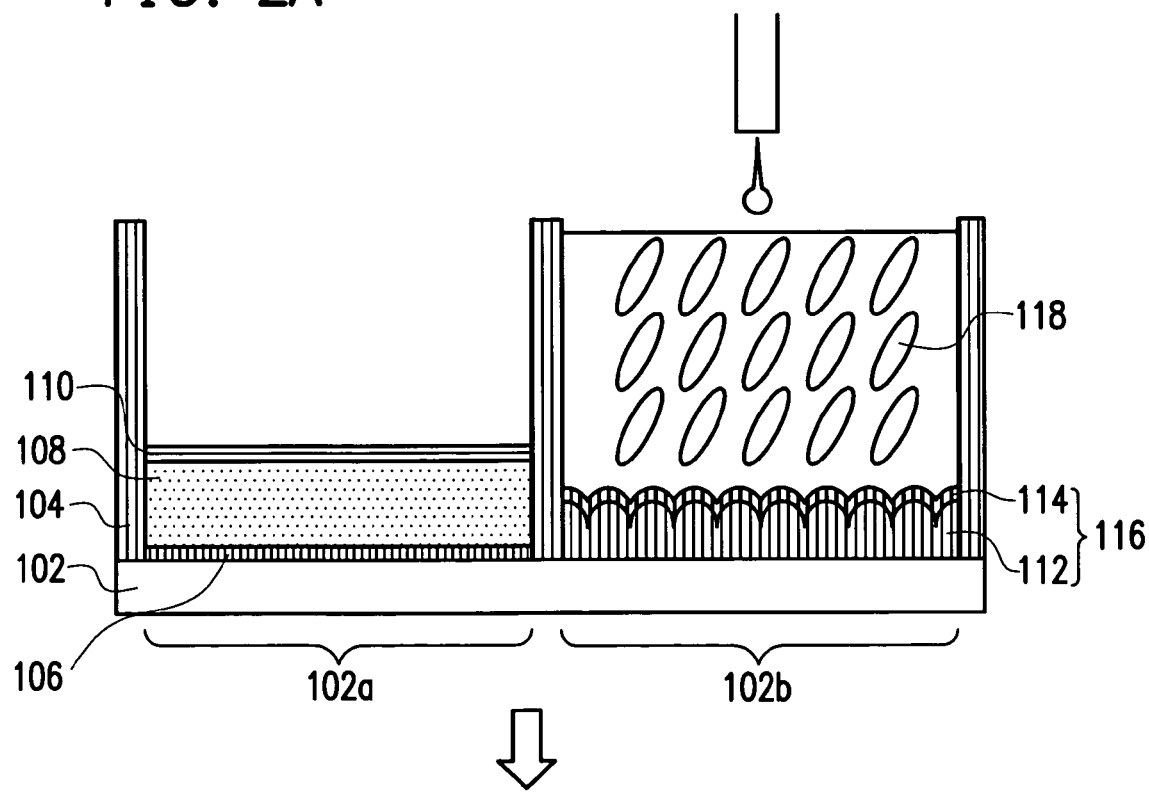

Referring to FIG. 2B, then as for the emissive displaying structure, the light-emitting active layer 108 and the upper electrode layer 110 are sequentially formed on the lower electrode layer 106 so as to complete the OLED structure. This OLED structure can emit lights from the lower electrode layer 106 towards the direction of the upper electrode layer 110. Then, as for the reflective displaying structure, a liquid crystal layer 118 is injected into the accommodation space on the reflective electrode layer 114.

Figure 2C:
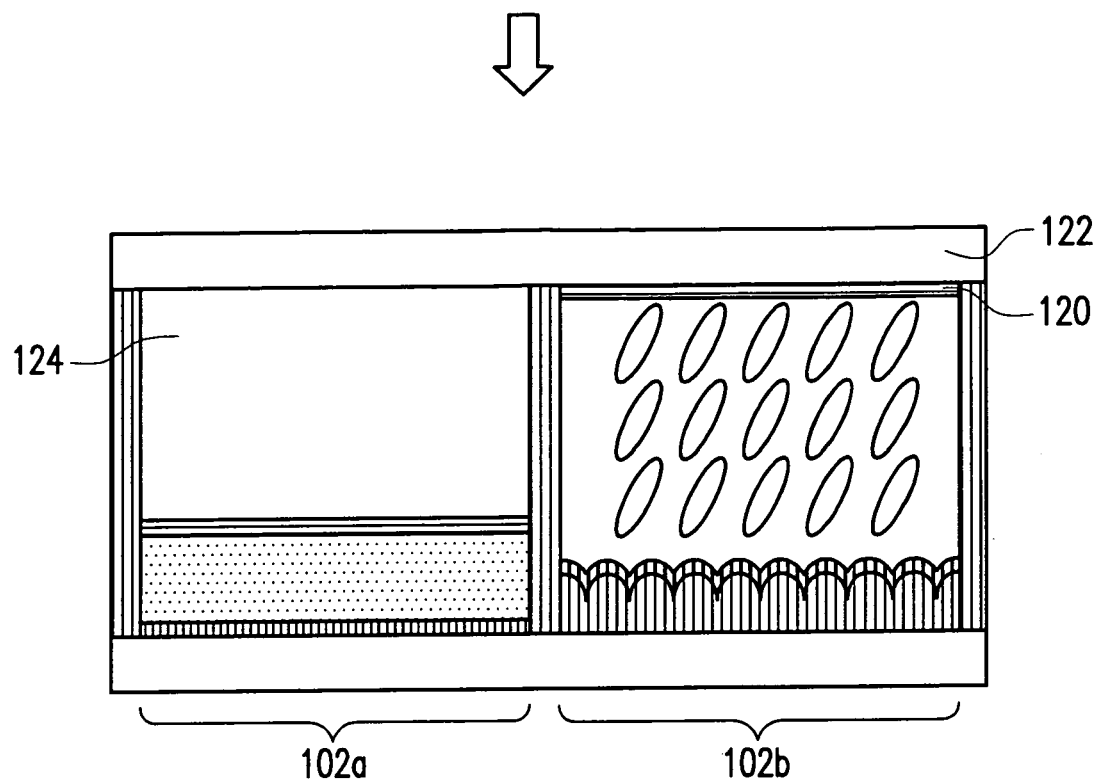

Referring to FIG. 2C, the wall structure 104 is covered by a second structural substrate 122. Just like the first structural substrate 102, the second structural substrate 122 has some element structures formed before hand, e.g., including an upper electrode layer 120 corresponding to the reflective region 102b. The liquid crystal layer 118 is sealed within a space corresponding to the reflective region 102b by the second structural substrate 122, and the orientation of liquid crystal molecules is controlled by the upper electrode layer 120 and the reflective electrode layer 114.

As described in FIG. 1, in the LCD structure of the reflective region 102b, the ambient light is used as a displaying light source; the OLED structure in the emissive region 102a can emit lights itself.

Figure 2D:
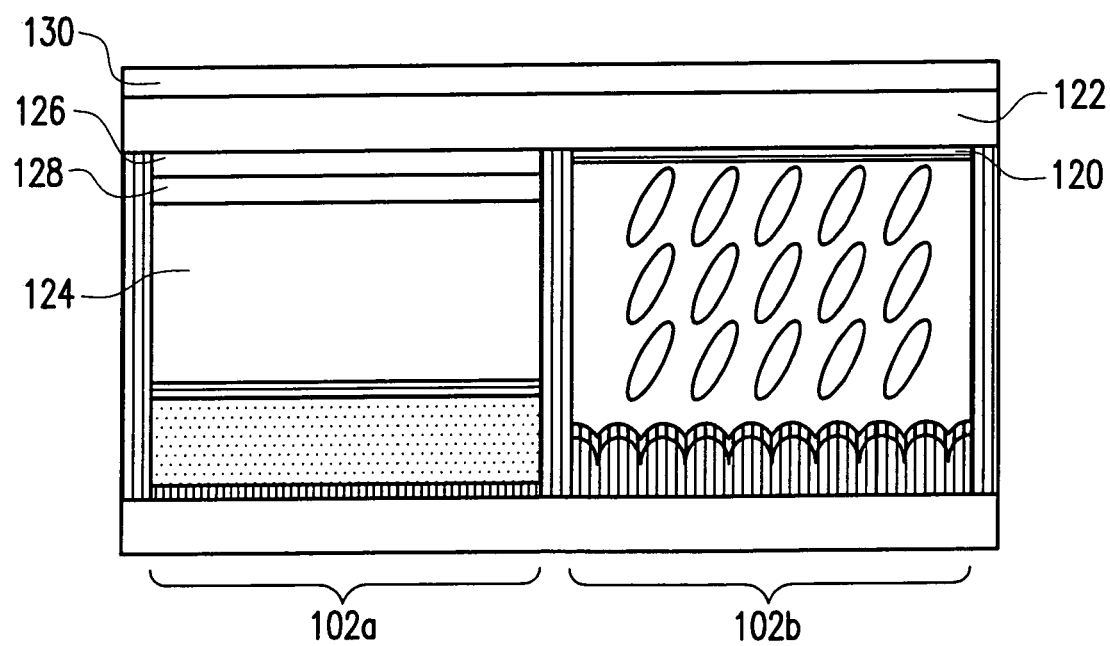

Referring to FIG. 2D, since the emissive region 102a can also receive the ambient light at the same time, and since part of the light may be reflected by the upper electrode layer 110, the displaying quality will be affected. Here, an anti-reflective structure can be disposed on the second structural substrate 122. For example, a polarizer 126 and a ¼-wave plate 128 can be formed on the second structural substrate 122. When a non-polarized ambient light is incidental to the polarizer 126, only the linear polarized light can pass there-through. Then the light is converted into a right-circularly polarized light after passing through the ¼-wave plate 128 and is converted into a left-circularly polarized light after being reflected by the emissive region, and then the left-circularly polarized light is converted back to the linear polarized light after passing through the ¼-wave plate 128 again. However, the linear polarized direction at this time is perpendicular to the direction of the linear polarized light originally passing through the polarizer; therefore, the light cannot pass through the polarizer 126. In addition, depending on the requirements of the actual design, other shared functional layers 130 that required can also be formed on the second structural substrate 122, for example, the second polarized layer, and the like.

Furthermore, the displaying mechanism of FIG. 2D is to emit lights from the first structural substrate 102 towards the second structural substrate 122 for displaying. Here, the space 124 in the emissive region 102a can be in a hollow state. Furthermore, for example, when the wall structure 104 is covered by the second structural substrate 122, the liquid crystal molecules may leak into the space 124. Therefore, according to the same design principle, other variations can be made to make the light-emitting direction opposite to the direction in FIG. 1.

Figure 3A:
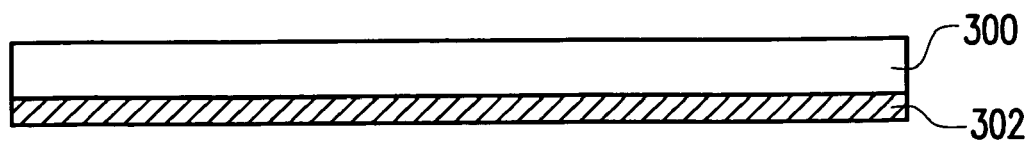
FIG. 3A-3F depict a flow chart for fabricating a display device according to one embodiment of the present invention.

FIG. 3A-3F depict a flow chart for fabricating a display device according to one embodiment of the present invention. In FIG. 3A, a polarizer 302 is formed on the first structural substrate 300. This polarizer 302 can be shared by the emissive region and the reflective region. Moreover, depending on actual requirements, other shared functional layer structures and circuit structures also can be included.

Figure 3B:
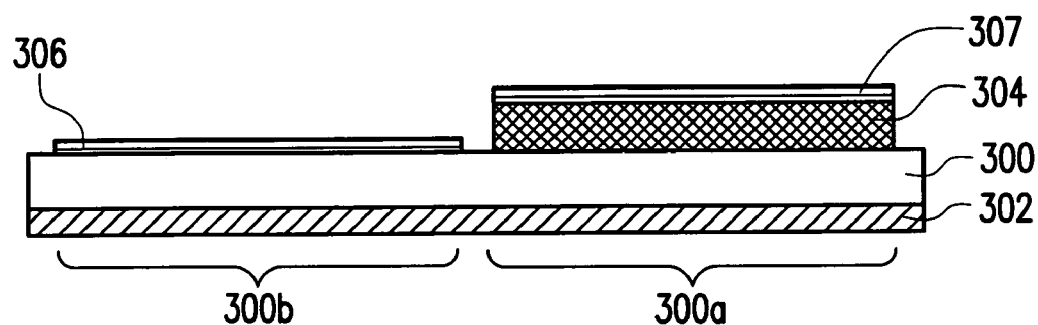

In FIG. 3B, a ¼-wave plate 304 is formed in the emissive region 300a of the first structural substrate 300 at the other side. Furthermore, an upper electrode layer 306 and an upper electrode layer 307 are respectively formed in the reflective region 300b and the emissive region 300a of the first structural substrate 300, for example, through stamping. Moreover, there is a gap between the ¼-wave plate 304 and the upper electrode layer 306, i.e., the periphery of the emissive region 300a and the reflective region 300b.

Figure 3C:
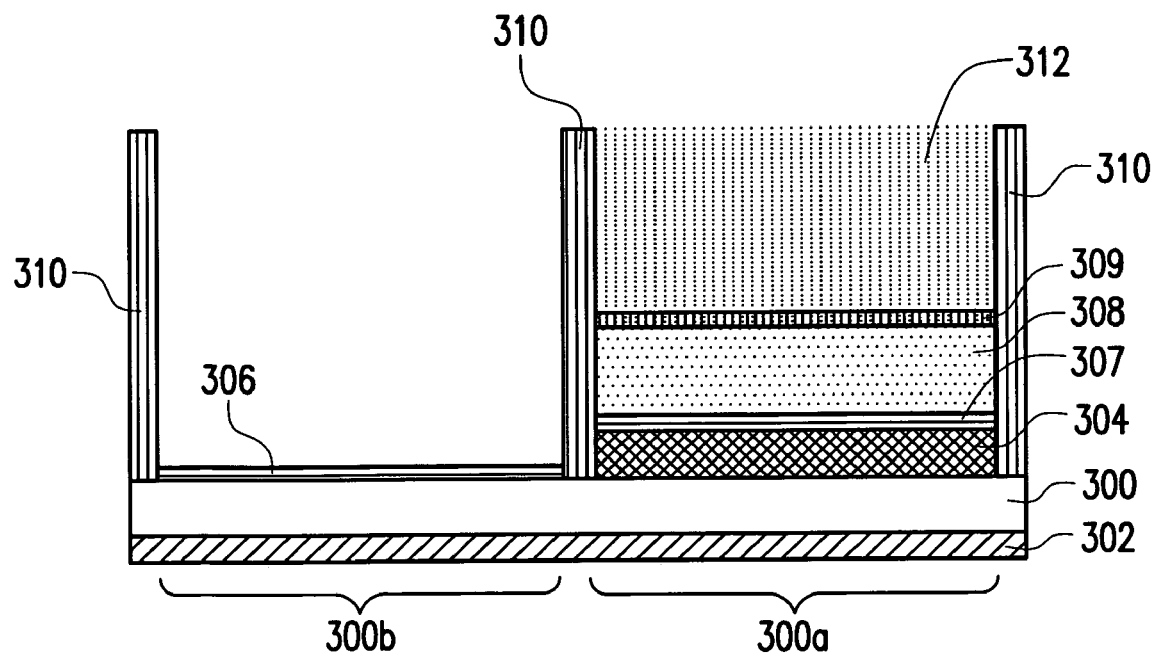

In FIG. 3C, a wall structure 310 is formed on the first structural substrate 300, for example, through stamping, for filling up the gap described above. Remarkably, the wall structure 310 can also be fabricated first, and then the polarizer 302, the ¼-wave plate 304, and the upper electrode layers 306 and 307 are fabricated. The forming sequences are not limited. Alternatively, the polarizer 302 also can be on the other side of the first structural substrate 300 (not shown in FIG. 3C) between the first structural substrate 300 and the wall structure 310 or even separated by the wall structure 310 in the reflective region 300b and the emissive region 300a. In other words, the first structural substrate 300 can include the above element structures that are fabricated before hand.

Then, a light-emitting structure (e.g., OLED) of the previous embodiment is formed on the polarizer 302 of the emissive region 300a, which further includes, for example, an upper electrode layer 307, a light-emitting active layer 308, and a reflective electrode layer 309. Then, a packing layer 312 corresponding to the emissive region 300a is formed within the space above the first structural substrate 300 and fills up the space, wherein the height of the packing layer 312 is consistent with that of the wall structure 310.

Figure 3D:
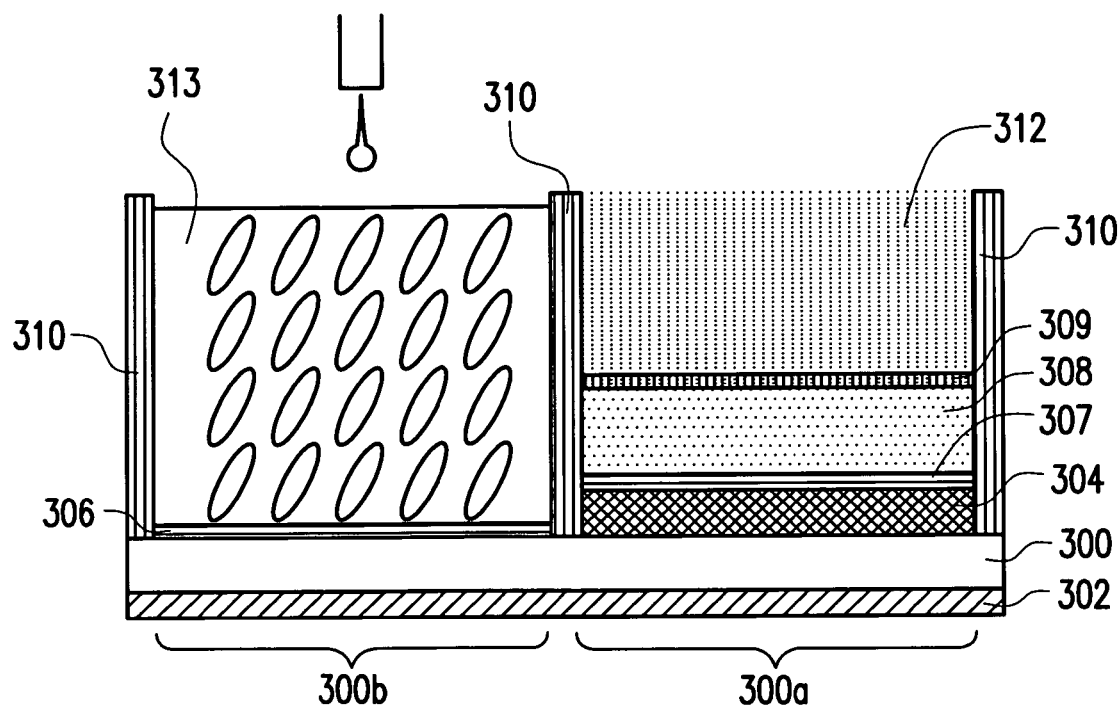

Referring to FIG. 3D, a liquid crystal layer 313 is formed above the first structural substrate 300 corresponding to the reflective region 300b and within the accommodation space surrounded by the wall structure 310.

Figure 3E:
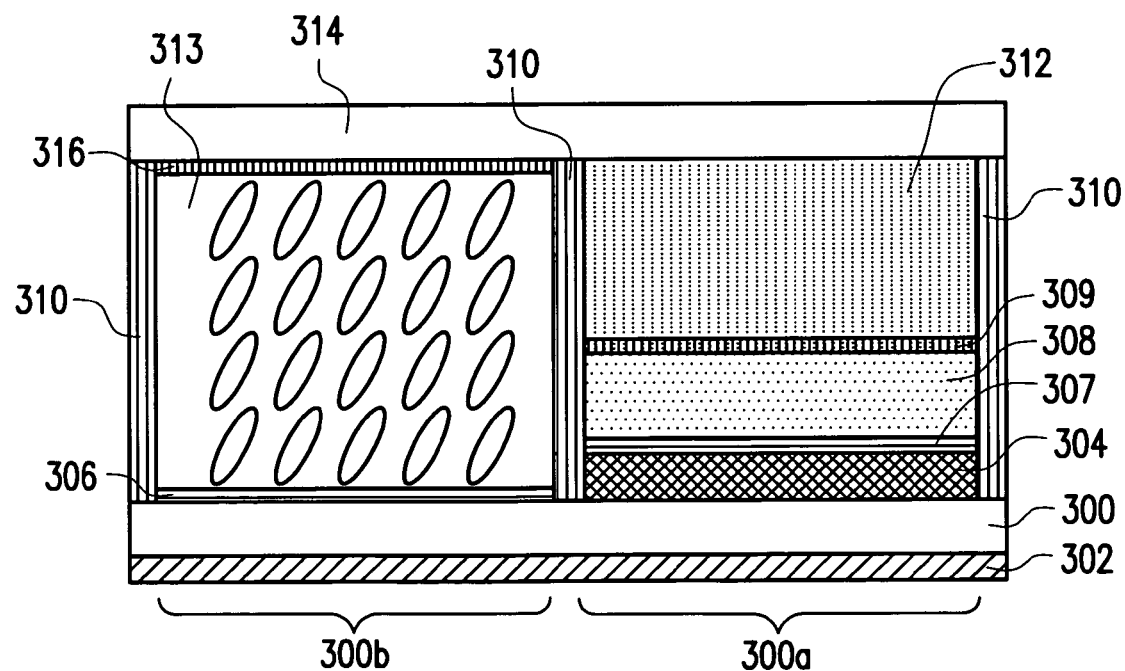

Referring to FIG. 3E, the wall structure 310 is covered by a second structural substrate 314, such that the emissive region 300a and the reflective region 300b above the first structural substrate 300 are sealed. Remarkably, the second structural substrate 314, as described in the above embodiments, has been provided with other element structures beforehand. For example, a reflective electrode structural layer 316 corresponding to the reflective region 300b has been formed on the second structural substrate 314. When the wall structure 310 is covered by the second structural substrate 314, the reflective electrode structural layer 316 drives the liquid crystal molecules of the liquid crystal layer 313 together with the upper electrode layer 306. The reflective electrode structural layer 316 also can have a roughened-surface structure.

Furthermore, when the wall structure 310 is covered by the second structural substrate 314, some liquid crystals may spill from the liquid crystal layer 313. Meanwhile, since the space of the emissive region 300a has been filled up by the packing layer 312, the light emitting of the emissive region 300a will not be affected. Moreover, the packing layer 312 can enable the light-emitting structure to be steadily disposed between the first structural substrate 300 and the second structural substrate 314.

Figure 3F:
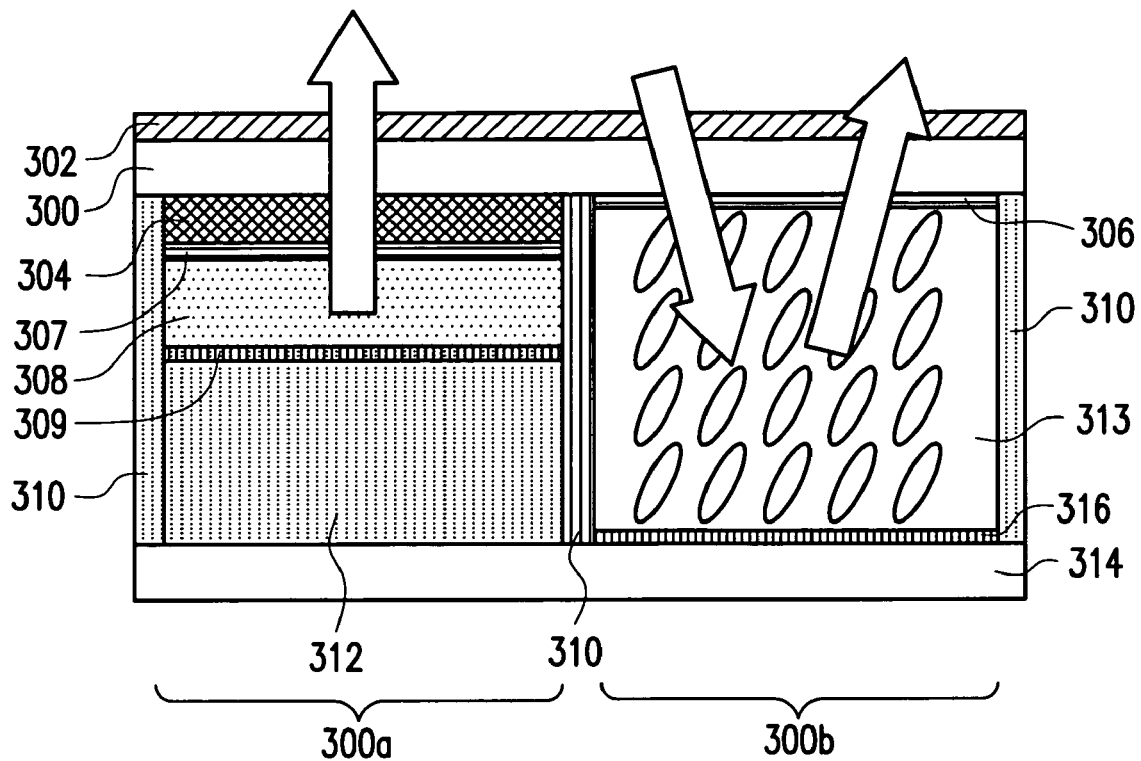

Referring to FIG. 3F, the light-emitting direction of the structure fabricated according to this fabricating method is shown by the arrows. In other words, the light-emitting direction of FIG. 3F is opposite to that of FIG. 1. In the emissive region 300a, an anti-reflective structure is formed by the polarizer 302 and the ¼-wave plate 304. In the reflective region 300b, the incident ambient light can be reflected by the reflective electrode layer 316 and can be directed outwards through the liquid crystal layer 313.

As for actual designs and applications, the methods and structures in some of the above embodiments can be used in combination with each other, and the present invention is not limited to the arrangement and design of any individual embodiment. Furthermore, depending on different designs, corresponding element structures are fabricated on the first structural substrate and the second structural substrate beforehand. When being fabricated, the element structures of the emissive region and the reflective region can be fabricated separately and also can be fabricated all together. For example, when the fabrication temperatures for the two regions are different and will be subject to different influences, the high-temperature resistant elements can be fabricated firstly, and then the low-temperature elements will be fabricated, thereby preventing the low-temperature elements from being damaged due to the temperature factor.

Figure 4:
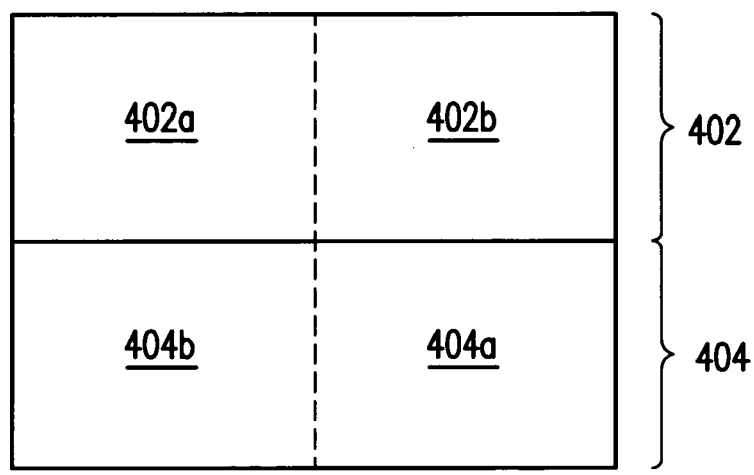
FIG. 4 depicts a pixel layout according to one embodiment of the present invention.

Furthermore, as for a pixel array combined by multiple pixels, the emissive region and the reflective region can be arranged interchangeably. FIG. 4 depicts a pixel layout according to one embodiment of the present invention. In FIG. 4, taking two adjacent pixels 402, 404 for example, each pixel can be of the above pixel structure, but the emissive region 402a of the pixel 402, for example, is on left side of the reflective region 402*b*, and the emissive region 404*a* of the pixel 404 is on the right side of the reflective region 404*b*. Furthermore, as for colored displaying, one pixel is composed of the above three pixel structures that generate lights of three primary colors, red, green, and blue respectively. All these are variations in actual designs.

A pixel is divided into an emissive region and a reflective region by a wall structure according to the present invention, to fabricate the corresponding displaying element structure. Some element structures of the present invention can be fabricated through stamping. The pixel structure provided by the present invention at least has a simple structure and is easy to be fabricated. Thus, through the present invention, manufacturing costs are reduced, production potentials are enhanced, and yields are improved.

Although the present invention is disclosed as above by preferred embodiments, they are not intended to limit the present invention. Various variations and modifications can be made by those skilled in the art without departing from the spirit and scope of the present invention, and the scope of the present invention shall be defined by the appended claims.

What is claimed is:

1. A display device, comprising:
    a first structural substrate with multiple pixel regions, wherein at least one of the pixel regions has an emissive region and a reflective region;
    a wall structure, located on the first structural substrate, and surrounding a periphery of the emissive region and the reflective region, and separating the emissive region and the reflective region;
    an emissive displaying structure, disposed in the emissive region of the first structural substrate;
    a reflective displaying structure, disposed in the reflective region of the first structural substrate; and
    a second structural substrate, covering the wall structure.

2. The display device as claimed in claim 1, wherein the reflective displaying structure comprises a liquid crystal displaying (LCD) structure, an electrophoresis displaying structure, or an electro-wetting displaying structure.

3. The display device as claimed in claim 1, wherein the emissive displaying structure comprises an organic light-emitting diode (OLED) structural layer or a polymer light-emitting diode (PLED) structural layer.

4. The display device as claimed in claim 1, wherein the emissive displaying structure substantially emits lights from the first structural substrate towards the direction of the second structural substrate.

5. The display device as claimed in claim 4, wherein the reflective displaying structure comprises a reflective electrode layer located on the first structural substrate to reflect an incident ambient light.

6. The display device as claimed in claim 4, wherein an electrode layer of the reflective displaying structure is located on the second structural substrate.

7. The display device as claimed in claim 4, further comprising an anti-reflective structural layer on the second structural substrate corresponding to the emissive region, in order to prevent the emissive region from emitting reflected light.

8. The display device as claimed in claim 1, wherein the emissive displaying structure substantially emits lights from the second structural substrate towards the direction of the first structural substrate.

9. The display device as claimed in claim 8, further comprising an anti-reflective structural layer between the first structural substrate and the emissive displaying structure corresponding to the emissive region, in order to prevent the emissive region from emitting reflected light.

10. The display device as claimed in claim 8, further comprising a packing layer located within a space surrounded by three elements: the second structural substrate, the emissive displaying structure, and the wall structure.

11. The display device as claimed in claim 8, wherein the reflective displaying structure comprises a reflective electrode layer located on the second structural substrate to reflect an incident ambient light.

12. The display device as claimed in claim 1, further comprising a shared functional plate disposed at the emissive region and the reflective region.

13. The display device as claimed in claim 1, wherein the reflective displaying structure comprises a color filter layer.

14. The display device as claimed in claim 1, wherein the pixel regions comprise multiple pixels with different colors so as to achieve colored display of an image, or comprise pixels with the same color to display the image by gray level.

15. A method for fabricating a display device, comprising:
    providing a first structural substrate with multiple pixel regions, wherein at least one of the pixel regions has an emissive region and a reflective region;
    forming a wall structure on the first structural substrate, wherein the wall structure surrounds a periphery of the emissive region and the reflective region, and separates the emissive region and the reflective region;
    forming an emissive displaying structure in the emissive region of the first structural substrate;
    forming a reflective displaying structure in the reflective region of the first structural substrate;
    providing a second structural substrate; and
    covering the second structural substrate on the wall structure.

16. The method for fabricating the display device as claimed in claim 15, wherein the step of forming the wall structure on the first substrate is formed by a stamping process.

17. The method for fabricating the display device as claimed in claim 15, wherein the two steps of forming the emissive displaying structure and forming the reflective displaying structure are performed respectively or mixed together.

18. The method for fabricating the display device as claimed in claim 15, wherein the step of forming the reflective displaying structure comprises forming a liquid crystal displaying (LCD) structure, or an electrophoresis displaying structure, or an electro-wetting displaying structure, or the like.

19. The method for fabricating the display device as claimed in claim 15, wherein the step of forming the emissive displaying structure comprises forming an OLED structural layer or a PLED structural layer.

20. The method for fabricating the display device as claimed in claim 15, wherein the formed emissive displaying structure substantially emits lights from the first structural substrate towards the direction of the second structural substrate.

21. The method for fabricating the display device as claimed in claim 20, wherein the step of forming the reflective displaying structure comprises forming a reflective electrode layer on the first structural substrate to reflect an incident ambient light.

22. The method for fabricating the display device as claimed in claim 20, wherein the emissive region of the second structural substrate comprises an anti-reflective structural layer to prevent the emissive region from emitting reflected light.

23. The method for fabricating the display device as claimed in claim 15, wherein the formed emissive displaying structure substantially emits lights from the second structural substrate towards the direction of the first structural substrate.

24. The method for fabricating the display device as claimed in claim 23, wherein the provided first structural substrate comprises an anti-reflective structural layer in the emissive region to prevent the emissive region from emitting reflected light.

25. The method for fabricating the display device as claimed in claim 23, wherein the step of forming an emissive displaying structure comprises forming a packing layer on the emissive displaying structure, wherein the height of the packing layer is equal to that of the wall structure.

26. The method for fabricating the display device as claimed in claim 23, wherein the step of forming a reflective displaying structure comprises forming a reflective electrode layer beforehand on the second structural substrate to reflect an incident ambient light.

27. The method for fabricating the display device as claimed in claim 15, further comprising forming a shared optical functional plate at the emissive region and the reflective region.

28. The method for fabricating the display device as claimed in claim 15, wherein the step of forming a reflective displaying structure comprises forming a color filter layer therein.

29. The method for fabricating the display device as claimed in claim 15, wherein in the provided first structural substrate, the positions of the pixel regions are predetermined to form multiple pixels with different colors, so as to achieve colored display of an image, or to form pixels with the same color to display the image by gray level.

* * * * *